(12) United States Patent
Zheng et al.

(10) Patent No.: US 11,699,907 B1
(45) Date of Patent: Jul. 11, 2023

(54) METHOD AND SYSTEM FOR DISPATCHING INDEPENDENT ENERGY STORAGE POWER STATION IN TYPICAL SECONDARY FREQUENCY REGULATION SCENARIO

(71) Applicant: North China Electric Power University, Beijing (CN)

(72) Inventors: Hua Zheng, Beijing (CN); Shiming Wang, Beijing (CN); Yifei Sun, Beijing (CN); Pei Peng, Beijing (CN); Li Xie, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 17/970,635

(22) Filed: Oct. 21, 2022

(30) Foreign Application Priority Data

May 18, 2022 (CN) .......................... 202210535814.X (51) Int. Cl.
| | |
|---|---|
| *H02J 3/46* | (2006.01) |
| *H02J 3/28* | (2006.01) |
| *G05B 17/02* | (2006.01) |
| *G01R 19/25* | (2006.01) |

(52) U.S. Cl.
CPC .......... *H02J 3/466* (2020.01); *G01R 19/2513* (2013.01); *G05B 17/02* (2013.01); *H02J 3/28* (2013.01)

(58) Field of Classification Search
CPC ........ H02J 3/466; H02J 3/28; G01R 19/2513; G05B 17/02
See application file for complete search history.

(56) References Cited

U.S. PATENT DOCUMENTS

| | | | | |
|---|---|---|---|---|
| 2015/0295402 A1* | 10/2015 | Black | ................ | H02J 13/00022 700/291 |
| 2016/0248260 A1* | 8/2016 | Kulyk | ............... | H02J 13/00028 |

* cited by examiner

*Primary Examiner* — Kabir A Timory
(74) *Attorney, Agent, or Firm* — Luedeka Neely Group PC (57) ABSTRACT

A method and a system for dispatching an independent energy storage power station is provided. The method includes: determining the current typical secondary frequency regulation scenario according to the predicted AGC frequency regulation instruction for the next stage; dispatching, for the continuous upward adjustment response scenario, the independent energy storage power station to participate in the upward adjustment response according to the data required for the continuous upward adjustment; dispatching, for the continuous downward adjustment response scenario, the independent energy storage power station to participate in the downward adjustment response according to the data required for the continuous downward adjustment; and preferably, for the upward and downward adjustment fluctuation response scenario, dispatching the independent energy storage power station to participate in the upward and downward adjustment fluctuation response according to the data required for the upward and downward adjustment.

4 Claims, 3 Drawing Sheets

METHOD AND SYSTEM FOR DISPATCHING INDEPENDENT ENERGY STORAGE POWER STATION IN TYPICAL SECONDARY FREQUENCY REGULATION SCENARIO

CROSS-REFERENCE TO RELATED APPLICATION

This patent application claims the benefit and priority of Chinese Patent Application No. 202210535814.X filed with the China National Intellectual Property Administration on May 18, 2022, the disclosure of which is incorporated by reference herein in its entirety as part of the present application.

TECHNICAL FIELD

The present disclosure relates to the technical field of power supply and distribution, in particular to a method and a system for dispatching an independent energy storage power station in a typical secondary frequency regulation scenario.

BACKGROUND

With the shortage of fossil energy supply and the increasingly serious environmental problems such as greenhouse effect, it is an inevitable trend of energy development in China and even the whole world to realize the transformation of renewable energy. In order to achieve the goal of transforming renewable energy, it is necessary to build a clean, low-carbon, safe and efficient energy system, implement renewable energy substitution actions, deepen the reformation of a power system, and build a new power system with new energy as the main body. Under the background of building a new power system, the proportion of new energy connected to the power system is increasing, and its power is intermittent, random and unpredictable, which brings many problems to the power grid. To convert the fluctuation of new energy to a short time scale of seconds or minutes, the power grid urgently needs frequency regulation resources.

As a high-quality flexible resource, a new energy storage can solve the frequency regulation problem of a power system well. Compared with the traditional conventional unit, the new energy storage has the advantages of short delay time, fast adjustment speed, simple control link and high adjustment accuracy. The energy storage can participate in auxiliary frequency regulation services with other units in the form of combined frequency regulation, or directly participate in secondary frequency regulation in the form of an independent energy storage power station. The manner of directly participating in secondary frequency regulation in the form of an independent energy storage power station has many advantages, including: (1) the clearer measurement and settlement boundaries of the independently operated energy storage power station, which reduces the difficulty of operation; (2) being directly dispatched by the power grid and providing various auxiliary services for the power system; (3) gaining benefit directly through the frequency regulation auxiliary service market according to its own value, so that its investment evaluation scope is clearer.

At present, most research mainly focuses on the frequency regulation control strategy in the form of combined frequency regulation of energy storage and other units. There is little research on the dispatching strategy of the independent energy storage power station and on a typical secondary frequency regulation scenario. Therefore, there is an urgent need to study a strategy or method for dispatching an independent energy storage power station for different typical secondary frequency regulation scenarios in this field.

SUMMARY

The purpose of the present disclosure is to provide a method and a system for dispatching an independent energy storage power station in a typical secondary frequency regulation scenario. Different dispatching modes for the independent energy storage power station are used for different typical secondary frequency regulation scenarios, so that the overcharge and over-discharge of the battery can be improved while ensuring a higher economic efficiency and a better frequency regulation effect.

To achieve the above purpose, the present disclosure provides the following solutions.

A method is provided for dispatching an independent energy storage power station in a typical secondary frequency regulation scenario, including:
  predicting an AGC frequency regulation instruction for a next stage based on a frequency regulation control data for an automatic generation control AGC frequency regulation control area, where the frequency regulation control data includes a historical operation data of units in the AGC frequency regulation control area, a power generation plan, a load supply and demand condition and a power grid operation condition;
  determining a current typical secondary frequency regulation scenario according to the AGC frequency regulation instruction for the next stage, where the typical secondary frequency regulation scenario includes a continuous upward adjustment response scenario, a continuous downward adjustment response scenario and an upward and downward adjustment fluctuation response scenario;
  acquiring data required for a continuous upward adjustment, if the current typical secondary frequency regulation scenario is the continuous upward adjustment response scenario, where the data required for the continuous upward adjustment includes a currently required upward adjustment response capacity of the power grid, a currently available upward adjustment response capacity of the independent energy storage power station and a currently available upward adjustment response capacity of a conventional unit;
  dispatching, for the continuous upward adjustment response scenario, the independent energy storage power station to participate in an upward adjustment response according to the data required for the continuous upward adjustment;
  acquiring data required for a continuous downward adjustment, if the current typical secondary frequency regulation scenario is the continuous downward adjustment response scenario, where the data required for the continuous downward adjustment includes a currently required downward adjustment response capacity of the power grid, a currently available downward adjustment response capacity of the independent energy storage power station and a currently available downward adjustment response capacity of the conventional unit;
  dispatching, for the continuous downward adjustment response scenario, the independent energy storage power station to participate in the downward adjustment response according to the data required for the continuous downward adjustment;

acquiring data required for the upward and downward adjustment, if the current typical secondary frequency regulation scenario is the upward and downward adjustment fluctuation response scenario, where the data required for the upward and downward adjustment includes the currently required upward adjustment response capacity of the power grid, the currently available upward adjustment response capacity of the independent energy storage power station, the currently required downward adjustment response capacity of the power grid and the currently available downward adjustment response capacity of the independent energy storage power station; and preferably dispatching, for the upward and downward adjustment fluctuation response scenario, the independent energy storage power station to participate in the upward and downward adjustment fluctuation response according to the data required for the upward and downward adjustment.

Optionally, before the determining a current typical secondary frequency regulation scenario according to the AGC frequency regulation instruction for the next stage, the method may further include:

determining whether it is a period of time when the independent energy storage power station is dispatched to participate in the secondary frequency regulation; if so, proceeding to the determining a current typical secondary frequency regulation scenario according to the AGC frequency regulation instruction for the next stage; if not, ending dispatching process.

Optionally, the dispatching the independent energy storage power station to participate in the upward adjustment response according to the data required for the continuous upward adjustment in the continuous upward adjustment response scenario may include:

determining, for the continuous upward adjustment response scenario, a secondary frequency regulation value $C_{st}^{up}$ when the independent energy storage power station participates in the upward adjustment response, by using a formula $C_{st}^{up}=\min(C_{st\_up} \times C_{up}/(C_{st\_up}+C_{gen\_up}), C_{st\_up})$, according to the data required for the continuous upward adjustment, where $C_{up}$ denotes the currently required upward adjustment response capacity of the power grid, $C_{st\_up}$ denotes the currently available upward adjustment response capacity of the independent energy storage power station, $C_{gen\_up}$ denotes the currently available upward adjustment response capacity of the conventional unit, and min ( ) indicates to take a minimum value of a parameter in parentheses; and dispatching the independent energy storage power station to participate in the upward adjustment response according to the secondary frequency regulation value $C_{st}^{up}$ when the independent energy storage power station participates in the upward adjustment response.

Optionally, the dispatching, for the continuous downward adjustment response scenario, the independent energy storage power station to participate in the downward adjustment response according to the data required for the continuous downward adjustment may include:

determining, for the continuous downward adjustment response scenario, a secondary frequency regulation value $C_{st}^{dn}$ when the independent energy storage power station participates in the downward adjustment response, by using a formula $C_{st}^{dn}=\min(C_{st\_dn} \times C_{dn}/(C_{st\_dn}+C_{gen\_dn}), C_{st\_dn})$, according to the data required for the continuous downward adjustment, where $C_{dn}$ denotes the currently required downward adjustment response capacity of the power grid, $C_{st\_dn}$ denotes the currently available downward adjustment response capacity of the independent energy storage power station, $C_{gen\_dn}$ denotes the currently available downward adjustment response capacity of the conventional unit, and min indicates to take a minimum value of a parameter in parentheses; and dispatching the independent energy storage power station to participate in the downward adjustment response according to the secondary frequency regulation value $C_{st}^{dn}$ when the independent energy storage power station participates in the downward adjustment response.

Optionally, for the upward and downward adjustment fluctuation response scenario, the independent energy storage power station is dispatched to participate in the upward and downward adjustment fluctuation response according to the data required for the upward and downward adjustment may specifically include:

for the upward and downward adjustment response scenario, according to the data required for the upward and downward adjustment, determining a secondary frequency regulation value $C_{st}^{up}$ when the independent energy storage power station participates in the upward adjustment response, by using a formula $C_{st}^{up}=\min(C_{st\_up}, C_{up})$, and determining a secondary frequency regulation value $C_{st}^{dn}$ when the independent energy storage power station participates in the downward adjustment response, by using a formula $C_{st}^{dn}=\min(C_{st\_dn}, C_{dn})$, where $C_{up}$ denotes the currently required upward adjustment response capacity of the power grid, $C_{st\_up}$ denotes the currently available upward adjustment response capacity of the independent energy storage power station, $C_{dn}$ denotes the currently required downward adjustment response capacity of the power grid, $C_{st\_dn}$ denotes the currently available downward adjustment response capacity of the independent energy storage power station, and min ( ) indicates to take a minimum value of a parameter in parentheses; and preferably dispatching the independent energy storage power station to participate in the upward and downward adjustment fluctuation response according to the secondary frequency regulation value $C_{st}^{up}$ when the independent energy storage power station participates in the upward adjustment response and the secondary frequency regulation value $C_{st}^{dn}$ when the independent energy storage power station participates in the downward adjustment response.

A system for dispatching an independent energy storage power station in a typical secondary frequency regulation scenario is provided, including:

an AGC frequency regulation instruction predicting module, which is configured to predict an AGC frequency regulation instruction for a next stage based on a frequency regulation control data for an automatic generation control AGC frequency regulation control area, where the frequency regulation control data includes historical operation data of units in the AGC frequency regulation control area, a power generation plan, a load supply and demand condition and a power grid operation condition;

a typical secondary frequency regulation scenario determining module, which is configured to determine the current typical secondary frequency regulation scenario according to the AGC frequency regulation instruction for the next stage, where the typical secondary frequency regulation scenario includes a continuous upward adjustment response scenario, a continuous downward adjustment response scenario and an upward and downward adjustment fluctuation response scenario;

a continuous upward adjustment data acquiring module, which is configured to, if the current typical secondary frequency regulation scenario is the continuous upward adjustment response scenario, acquire data required for a continuous upward adjustment, where the data required for the continuous upward adjustment includes a currently required upward adjustment response capacity of the power grid, a currently available upward adjustment response capacity of the independent energy storage power station and a currently available upward adjustment response capacity of a conventional unit;

a continuous upward adjustment response module, which is configured to, for the continuous upward adjustment response scenario, dispatch the independent energy storage power station to participate in an upward adjustment response according to the data required for the continuous upward adjustment;

a continuous downward adjustment data acquiring module, which is configured to, if the current typical secondary frequency regulation scenario is the continuous downward adjustment response scenario, acquire data required for a continuous downward adjustment, where the data required for the continuous downward adjustment includes a currently required downward adjustment response capacity of the power grid, a currently available downward adjustment response capacity of the independent energy storage power station and a currently available downward adjustment response capacity of the conventional unit;

a continuous downward adjustment response module, which is configured to, for the continuous downward adjustment response scenario, call the independent energy storage power station to participate in the downward adjustment response according to the data required for the continuous downward adjustment;

an upward and downward adjustment data acquiring module, which is configured to, if the current typical secondary frequency regulation scenario is the upward and downward adjustment fluctuation response scenario, acquire data required for the upward and downward adjustment, where the data required for the upward and downward adjustment includes the currently required upward adjustment response capacity of the power grid, the currently available upward adjustment response capacity of the independent energy storage power station, the currently required downward adjustment response capacity of the power grid and the currently available downward adjustment response capacity of the independent energy storage power station; and an upward and downward adjustment fluctuation response module, which is configured to, for the upward and downward adjustment fluctuation response scenario, preferably dispatch the independent energy storage power station to participate in the upward and downward adjustment fluctuation response according to the data required for the upward and downward adjustment.

Optionally, the system may further include a secondary frequency regulation time period determining module, which is configured to determining whether it is a period of time when the independent energy storage power station is dispatched to participate in the secondary frequency regulation, and if so, performing the typical secondary frequency regulation scenario determining module, and if not, ending the dispatching process.

Optionally, the continuous upward adjustment response module may include:

an upward adjustment response-based secondary frequency regulation value calculating unit, which is configured to, for the continuous upward adjustment response scenario, determine a secondary frequency regulation value $C_{st}^{up}$ when the independent energy storage power station participates in the upward adjustment response, by using a formula $C_{st}^{up}=\min(C_{st\_up} \times C_{up}/(C_{st\_up}+C_{gen\_up}), C_{st\_up})$, according to the data required for the continuous upward adjustment, where $C_{up}$ denotes the currently required upward adjustment response capacity of the power grid, $C_{st\_up}$ denotes the currently available upward adjustment response capacity of the independent energy storage power station, $C_{gen\_up}$ denotes the currently available upward adjustment response capacity of the conventional unit, and min ( ) indicates to take a minimum value of the parameter in parentheses; and a continuous upward adjustment response unit, which is configured to dispatch the independent energy storage power station to participate in the upward adjustment response according to the secondary frequency regulation value $C_{st}^{up}$ when the independent energy storage power station participates in the upward adjustment response.

Optionally, the continuous downward adjustment response module may include:

a downward adjustment response-based secondary frequency regulation value calculating unit, which is configured to, for the continuous downward adjustment response scenario, determine a secondary frequency regulation value $C_{st}^{dn}$ when the independent energy storage power station participates in the downward adjustment response, by using a formula $C_{st}^{dn}=\min(C_{st\_dn} \times C_{dn}/(C_{st\_dn}+C_{gen\_dn}), C_{st\_dn})$, according to the data required for the continuous downward adjustment, where $C_{dn}$ denotes the currently required downward adjustment response capacity of the power grid, $C_{st\_dn}$ denotes the currently available downward adjustment response capacity of the independent energy storage power station, $C_{gen\_dn}$ denotes the currently available downward adjustment response capacity of a conventional unit, and min ( ) indicates to take a minimum value of a parameter in parentheses; and a continuous downward adjustment response unit, which is configured to, dispatch the independent energy storage power station to participate in the downward adjustment response according to the secondary frequency regulation value $C_{st}^{dn}$ when the independent energy storage power station participates in the downward adjustment response.

Optionally, the upward and downward adjustment fluctuation response module may include:

an upward and downward adjustment response-based secondary frequency regulation value calculating unit, which is configured to, for the upward and downward adjustment response scenario, according to the data required for the upward and downward adjustment, determine a secondary frequency regulation value when $C_{st}^{up}$ the independent energy storage power station participates in the upward adjustment response, by using a formula $C_{st}^{up}=\min(C_{st\_up}, C_{up})$, and determine a secondary frequency regulation value $C_{st}^{dn}$ when the independent energy storage power station participates in the downward adjustment response, by using a formula $C_{st}^{dn}=\min(C_{st\_dn}, C_{dn})$, where $C_{up}$ denotes the currently required upward adjustment response capacity of the power grid, $C_{st\_up}$ denotes the currently available upward adjustment response capacity of the independent energy storage power station, $C_{dn}$ denotes the currently required downward adjustment response capacity of the power grid, $C_{st\_dn}$ denotes the currently available downward adjustment response capacity of the independent energy storage power station, and min ( ) indicates to take a minimum value of a parameter in parentheses; and an upward and downward adjustment fluctuation response unit, which is configured to preferably dispatch the independent energy storage power station to participate in the upward and downward adjustment fluctuation response according to the secondary frequency regulation value $C_{st}^{up}$ when the independent energy storage power station participates in the upward adjustment response and the secondary frequency regulation value $C_{st}^{dn}$ when the independent energy storage power station participates in the downward adjustment response.

According to the specific embodiment provided by the present disclosure, the following technical effects are disclosed.

The present disclosure relates to a method and a system for dispatching an independent energy storage power station in a typical secondary frequency regulation scenario. The method includes: predicting an AGC frequency regulation instruction for a next stage based on a frequency regulation control data of an automatic generation control AGC frequency regulation control area; determining a current typical secondary frequency regulation scenario according to the AGC frequency regulation instruction for the next stage, where the typical secondary frequency regulation scenario includes a continuous upward adjustment response scenario, a continuous downward adjustment response scenario and an upward and downward adjustment fluctuation response scenario; acquiring data required for a continuous upward adjustment, if the current typical secondary frequency regulation scenario is the continuous upward adjustment response scenario; dispatching, for the continuous upward adjustment response scenario, the independent energy storage power station to participate in an upward adjustment response according to the data required for the continuous upward adjustment; acquiring data required for a continuous downward adjustment, if the current typical secondary frequency regulation scenario is the continuous downward adjustment response scenario; dispatching, for the continuous downward adjustment response scenario, the independent energy storage power station to participate in the downward adjustment response according to the data required for the continuous downward adjustment; acquiring data required for the upward and downward adjustment, if the current typical secondary frequency regulation scenario is the upward and downward adjustment fluctuation response scenario; and preferably dispatching, for the upward and downward adjustment fluctuation response scenario, the independent energy storage power station to participate in the upward and downward adjustment fluctuation response according to the data required for the upward and downward adjustment. According to the method, different independent energy storage power station dispatching modes are used for different typical secondary frequency regulation scenarios, so that the overcharge and over-discharge of the battery can be improved while ensuring a higher economic efficiency and a better frequency regulation effect.

BRIEF DESCRIPTION OF THE DRAWINGS

In order to explain the embodiments of the present disclosure or the technical solutions in the prior art more clearly, the drawings that need to be used in the embodiments will be briefly introduced hereinafter. Obviously, the drawings in the following description are only part of the embodiments of the present disclosure. For those skilled in the art, other drawings can be obtained according to these drawings without creative labor.

DETAILED DESCRIPTION OF THE EMBODIMENTS

The technical solutions in the embodiments of the present disclosure will be clearly and completely described with reference to the drawings in the embodiments of the present disclosure hereinafter. Obviously, the described embodiments are only part of the embodiments of the present disclosure, rather than all of the embodiments. Based on the embodiments of the present disclosure, all other embodiments obtained by those skilled in the art without creative labor are within the scope of protection of the present disclosure.

The purpose of the present disclosure is to provide a method and a system for dispatching an independent energy storage power station in a typical secondary frequency regulation scenario. Different dispatching modes for the independent energy storage power station are used for different typical secondary frequency regulation scenarios, so that the overcharge and over-discharge of the battery can be improved while ensuring a higher economic efficiency and a better frequency regulation effect.

In order to make the above objects, features and advantages of the present disclosure more obvious and understandable, the present disclosure will be explained in further detail with reference to the drawings and detailed description hereinafter.

Figure 1:
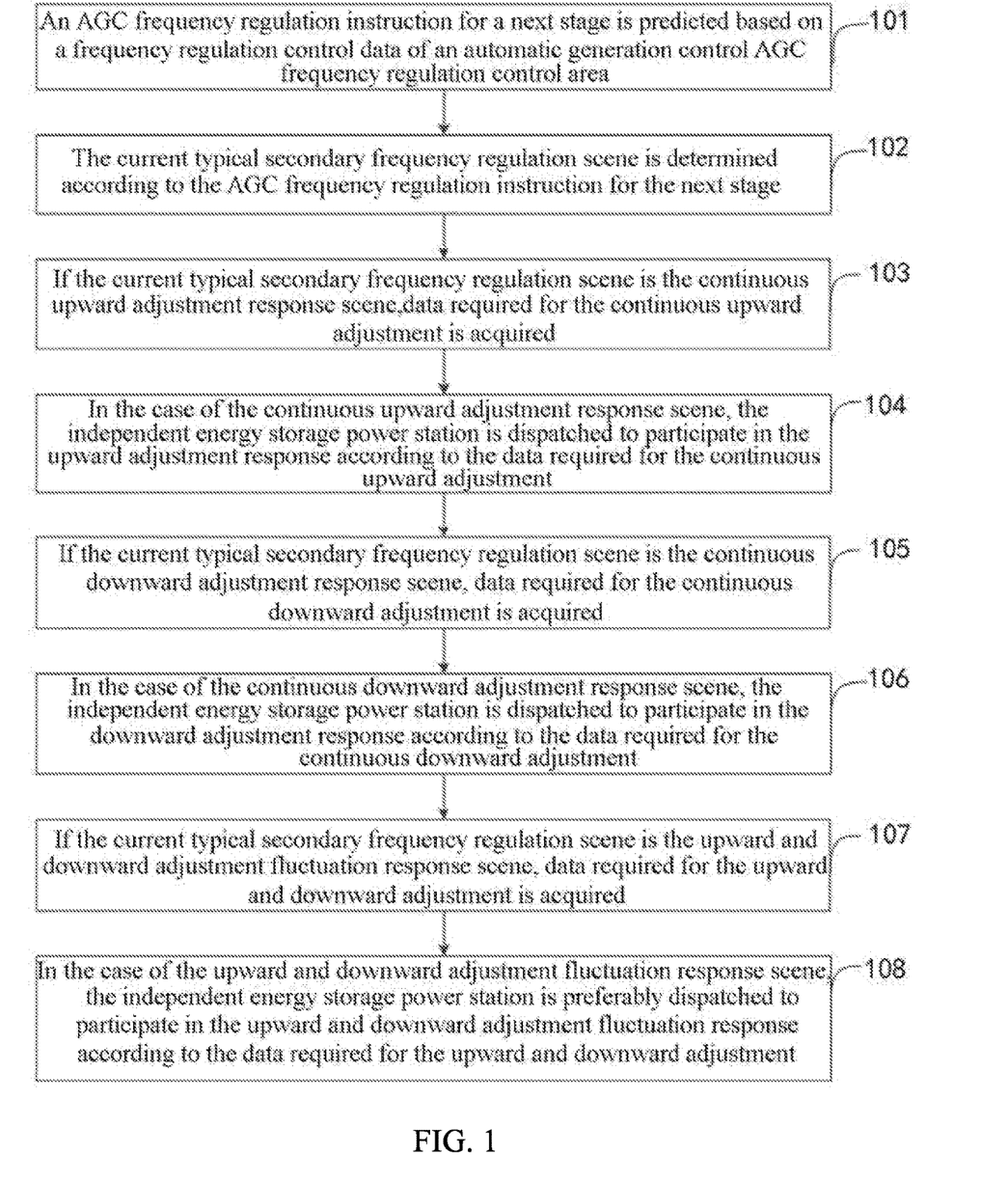
FIG. 1 is a flowchart of a method for dispatching an independent energy storage power station in a typical secondary frequency regulation scenario according to the present disclosure.

FIG. 1 is a flowchart of a method for dispatching an independent energy storage power station in a typical secondary frequency regulation scenario according to the present disclosure. As shown in FIG. 1, a method for dispatching an independent energy storage power station in a typical secondary frequency regulation scenario according to the present disclosure comprises the following steps 101 to 108.

In step 101, an AGC frequency regulation instruction for a next stage is predicted based on a frequency regulation control data of an automatic generation control AGC frequency regulation control area.

The frequency regulation control data includes a historical operation data of units in the AGC frequency regulation control area, a power generation plan, a load supply and demand condition and a power grid operation condition. The AGC frequency regulation instruction for the next stage is predicted based on the factors such as the historical operation data of units, the power generation plan, the load supply and demand condition and the power grid operation condition for the Automatic Generation Control (AGC) frequency regulation control area.

In step 102, the current typical secondary frequency regulation scenario is determined according to the AGC frequency regulation instruction for the next stage.

At present, most researches mainly focus on the frequency regulation control strategy in the form of combined frequency regulation of energy storage and other units. There are few researches on the strategy of dispatching the independent energy storage power station and on a typical secondary frequency regulation scenario. Among the secondary frequency regulation scenarios in which conventional units or independent energy storage power stations are involved, there are mainly the following three typical secondary frequency regulation scenarios: 1) the continuous upward adjustment response scenario, in which the Automatic Generation Control (AGC) instruction issues a continuous upward frequency regulation instruction; 2) the continuous downward adjustment response scenario, in which the AGC frequency regulation instruction issues a continuous downward frequency modulation instruction; and 3) the up- and downward adjustment fluctuation response scenario, in which the current AGC frequency regulation instruction issues the upward/downward frequency regulation instruction, and the next AGC frequency regulation instruction issues the downward/upward frequency regulation instruction. Therefore, for the control strategy by which the dispatching center dispatches independent energy storage power stations to participate in secondary frequency regulation, the present disclosure provides an independent energy storage power station dispatching strategy for different typical secondary frequency regulation scenarios in consideration of continuous upward adjustment response, continuous downward adjustment response and upward and downward adjustment fluctuation response scenarios.

If the AGC frequency regulation instruction for the next stage issues the continuous upward frequency regulation instruction, it is determined that the current typical secondary frequency regulation scenario is the continuous upward adjustment response scenario; if the AGC frequency regulation instruction for the next stage issues the continuous downward frequency regulation instruction, it is determined that the current typical secondary frequency regulation scenario is the continuous downward adjustment response scenario; if the current AGC frequency regulation instruction in the AGC frequency regulation instruction for the next stage issues the upward/downward frequency regulation instruction, and then an AGC frequency regulation instruction issues the downward/upward frequency regulation instruction, it is determined that the current typical secondary frequency regulation scenario is the upward and downward adjustment fluctuation response scenario. Where, "/" means "or".

In practical application, prior to the step 102 of determining the current typical secondary frequency regulation scenario according to the AGC frequency regulation instruction for the next stage, the method further comprises:

determining whether it is a period of time when the independent energy storage power station is dispatched to participate in the secondary frequency regulation; if so, proceedings to steps 102; if not, ending the dispatching process.

In step 103, if the current typical secondary frequency regulation scenario is the continuous upward adjustment response scenario, data required for the continuous upward adjustment is acquired.

The data required for the continuous upward adjustment includes the currently required upward adjustment response capacity $C_{up}$ of the power grid, the currently available upward adjustment response capacity $C_{st\_up}$ of the independent energy storage power station and the currently available upward adjustment response capacity $C_{gen\_up}$ of a conventional unit.

In step 104, in the case of the continuous upward adjustment response scenario, the independent energy storage power station is dispatched to participate in the upward adjustment response according to the data required for the continuous upward adjustment.

First, in the case of the continuous upward adjustment response scenario, a secondary frequency regulation value $C_{st}^{up}$ when the independent energy storage power station participates in the upward adjustment response is determined using a formula $C_{st}^{up}=\min(C_{st\_up} \times C_{up}/(C_{st\_up}+C_{gen\_up}), C_{st\_up})$, according to the data required for the continuous upward adjustment, wherein $C_{up}$ indicates the currently required upward adjustment response capacity of the power grid, $C_{st\_up}$ indicates the currently available upward adjustment response capacity of the independent energy storage power station, $C_{gen\_up}$ indicates the currently available upward adjustment response capacity of a conventional unit, and min ( ) indicates to take a minimum value of the parameter in parentheses. Thereafter, the independent energy storage power station is dispatched to participate in the upward adjustment response according to the secondary frequency regulation value $C_{st}^{up}$ when the independent energy storage power station participates in the upward adjustment response.

In step 105, if the current typical secondary frequency regulation scenario is the continuous downward adjustment response scenario, data required for the continuous downward adjustment is acquired.

The data required for the continuous downward adjustment includes the currently required downward adjustment response capacity $C_{dn}$ of the power grid, the currently available downward adjustment response capacity $C_{st\_dn}$ of the independent energy storage power station and the currently available downward adjustment response capacity $C_{gen\_dn}$ of a conventional unit.

In step 106, in the case of the continuous downward adjustment response scenario, the independent energy storage power station is dispatched to participate in the downward adjustment response according to the data required for the continuous downward adjustment.

First, in the case of the continuous downward adjustment response scenario, a secondary frequency regulation value $C_{st}^{dn}$ when the independent energy storage power station participates in the downward adjustment response is determined by using a formula $C_{st}^{dn}=\min(C_{st\_dn} \times C_{dn}/(C_{st\_dn}+C_{gen\_dn}), C_{st\_dn})$, according to the data required for the continuous downward adjustment, wherein $C_{dn}$ indicates the currently required downward adjustment response capacity of the power grid, $C_{st\_dn}$ indicates the currently available downward adjustment response capacity of the independent energy storage power station, $C_{gen\_dn}$ indicates the currently available downward adjustment response capacity of a conventional unit. Thereafter, the independent energy storage power station is dispatched to participate in the downward adjustment response according to the secondary frequency regulation value $C_{st}^{dn}$ when the independent energy storage power station participates in the downward adjustment response.

In step 107, if the current typical secondary frequency regulation scenario is the upward and downward adjustment fluctuation response scenario, data required for the upward and downward adjustment is acquired.

The data required for the upward and downward adjustment includes the currently required upward adjustment response capacity $C_{up}$ of the power grid, the currently available upward adjustment response capacity $C_{st\_up}$ of the independent energy storage power station, the currently required downward adjustment response capacity $C_{dn}$ of the power grid and the currently available downward adjustment response capacity $C_{st\_dn}$ of the independent energy storage power station.

In step 108, in the case of the upward and downward adjustment fluctuation response scenario, the independent energy storage power station is preferably dispatched to participate in the upward and downward adjustment fluctuation response according to the data required for the upward and downward adjustment.

First, in the case of the upward and downward adjustment response scenario, according to the data required for the upward and downward adjustment, the secondary frequency regulation value $C_{st}^{up}$ when the independent energy storage power station participates in the upward adjustment response is determined using a formula $C_{st}^{up}=\min(C_{st\_up}, C_{up})$, and the secondary frequency regulation value $C_{st}^{dn}$ when the independent energy storage power station participates in the downward adjustment response is determined using a formula $C_{st}^{dn}=\min(C_{st\_dn}, C_{dn})$, wherein $C_{up}$ indicates the currently required upward adjustment response capacity of the power grid, $C_{st\_up}$ indicates the currently available upward adjustment response capacity of the independent energy storage power station, $C_{dn}$ indicates the currently required downward adjustment response capacity of the power grid, and $C_{st\_dn}$ indicates the currently available downward adjustment response capacity of the independent energy storage power station. Thereafter, the independent energy storage power station is preferably dispatched to participate in the upward and downward adjustment fluctuation response according to the secondary frequency regulation value $C_{st}^{up}$ when the independent energy storage power station participates in the upward adjustment response and according to the secondary frequency regulation value $C_{st}^{dn}$ when the independent energy storage power station participates in the downward adjustment response.

It can be seen that, for the control strategy problem that the dispatching center dispatches independent energy storage power stations to participate in secondary frequency regulation, the present disclosure provides a method for dispatching an independent energy storage power station in a typical secondary frequency regulation scenario, which dispatches the independent energy storage power station in different ways for three different typical secondary frequency regulation scenarios: continuous upward adjustment response, continuous downward adjustment response, and upward and downward adjustment fluctuation response. Thus, the method reduces the overcharge and over-discharge problem of the independent energy storage power station while improving the economic efficiency that the independent energy storage power station participates in the frequency regulation auxiliary service market, and scientifically and efficiently solves the problem that the independent energy storage power station participates in secondary frequency regulation.

Figure 2:
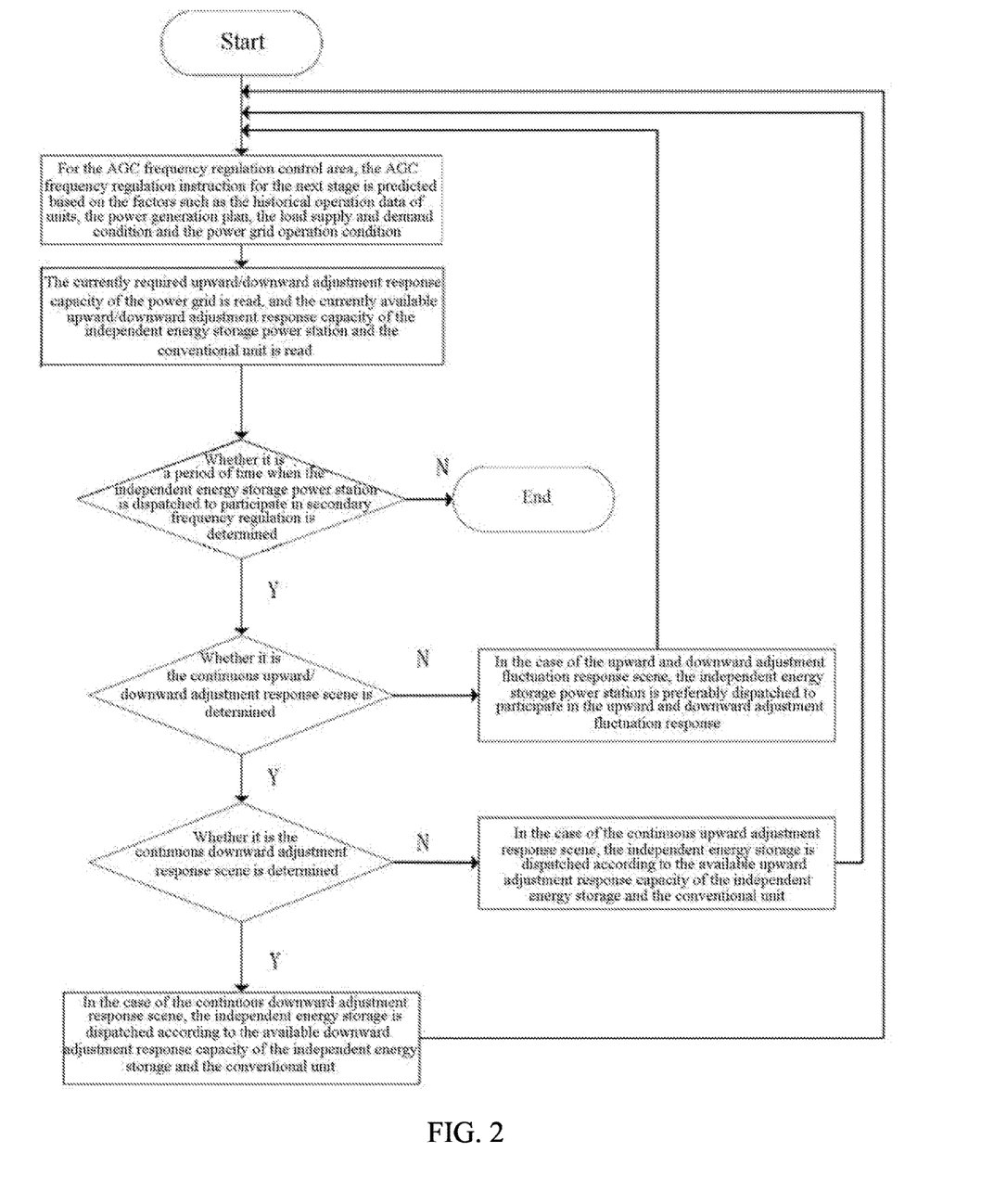
FIG. 2 is a flowchart of a method for dispatching an independent energy storage power station in a typical secondary frequency regulation scenario according to a specific embodiment of the present disclosure.

FIG. 2 is a flowchart of a method dispatching an independent energy storage power station in a typical secondary frequency regulation scenario according to a specific embodiment of the present disclosure. As shown in FIG. 2, the method according to a specific embodiment of the present disclosure is provided. The embodiment has the following steps (1) to (8).

In step (1), for the AGC frequency regulation control area, the AGC frequency regulation instruction for the next stage is predicted based on the factors such as the historical operation data of units, the power generation plan, the load supply and demand condition and the power grid operation condition.

In step (2), if the currently required upward adjustment response capacity of the power grid is $C_{up}$, the currently available upward adjustment response capacity $C_{st\_up}$ of the independent energy storage power station is read, and the currently available upward adjustment response capacity $C_{gen\_up}$ of the conventional unit is read. If the currently required downward adjustment response capacity of the power grid is $C_{dn}$, the currently available downward adjustment response capacity $C_{st\_dn}$ of the independent energy storage power station is read, and the currently available downward adjustment response capacity $C_{gen\_dn}$ of the conventional unit is read.

In step (3), whether it is a period of time when the independent energy storage power station is dispatched to participate in secondary frequency regulation is determined, if not, the dispatching process is ended, and if so, the process proceeds to the subsequent steps.

In step (4), a typical secondary frequency regulation scenario is determined, wherein if the AGC frequency regulation instruction for the next stage issues the continuous upward frequency regulation instruction, the typical secondary frequency regulation scenario is the continuous upward adjustment response scenario; if the AGC frequency regulation instruction for the next stage issues the continuous downward frequency regulation instruction, the typical secondary frequency regulation scenario is the continuous downward adjustment response scenario; if the current AGC frequency regulation instruction in the AGC frequency regulation instruction for the next stage issues the upward/downward frequency regulation instruction, and then an AGC frequency regulation instruction issues the downward/upward frequency regulation instruction, the typical secondary frequency regulation scenario is the upward and downward adjustment fluctuation response scenario.

In step (5), in the case of the upward and downward adjustment fluctuation response scenario, the independent energy storage power station is preferably dispatched to participate in the upward and downward adjustment fluctuation response. A secondary frequency regulation value when the independent energy storage power station participates in the upward adjustment response is $C_{st}^{up}=\min(C_{st\_up}, C_{up})$, and a secondary frequency regulation value when the independent energy storage power station participates in the downward adjustment response is $C_{st}^{dn}=\min(C_{st\_dn}, C_{dn})$.

In step (6), in the case of the continuous upward adjustment response scenario, the independent energy storage power station is dispatched according to the available upward adjustment response capacity of the independent energy storage power station (referred to as an energy storage or an independent energy storage) and the conventional unit (referred to as an unit), that is, the independent energy storage power station is dispatched to participate in the upward adjustment response, and the value participating in secondary frequency regulation is $C_{st}^{up}=\min(C_{st\_up} \times C_{up}/(C_{st\_up}+C_{gen\_up}), C_{st\_up})$.

In step (7), in the case of the continuous downward adjustment response scenario, the independent energy storage power station is dispatched according to the available downward adjustment response capacity of the independent energy storage power station and the conventional unit, that is, the independent energy storage power station is dispatched to participate in the downward adjustment response, and the value participating in secondary frequency regulation is $C_{st}^{dn}=\min(C_{st\_dn} \times C_{dn}/(C_{st\_dn}+C_{gen\_dn}), C_{st\_dn})$.

In step (8), the above steps are repeated until the dispatching process is ended.

In the method, a typical secondary frequency regulation scenario is divided into a continuous upward adjustment response scenario, a continuous downward adjustment response scenario, and an upward and downward adjustment fluctuation response scenario, which is useful for the classification and judgment of frequency regulation scenarios in the actual frequency regulation process. The present disclosure provides a method for dispatching an independent energy storage power station in a typical secondary frequency regulation scenario. Different dispatching modes for the independent energy storage power station are adopted for different typical secondary frequency regulation scenarios, so that the overcharge and over-discharge of the battery can be reduced while ensuring a higher economic efficiency and a better frequency regulation effect.

Figure 3:
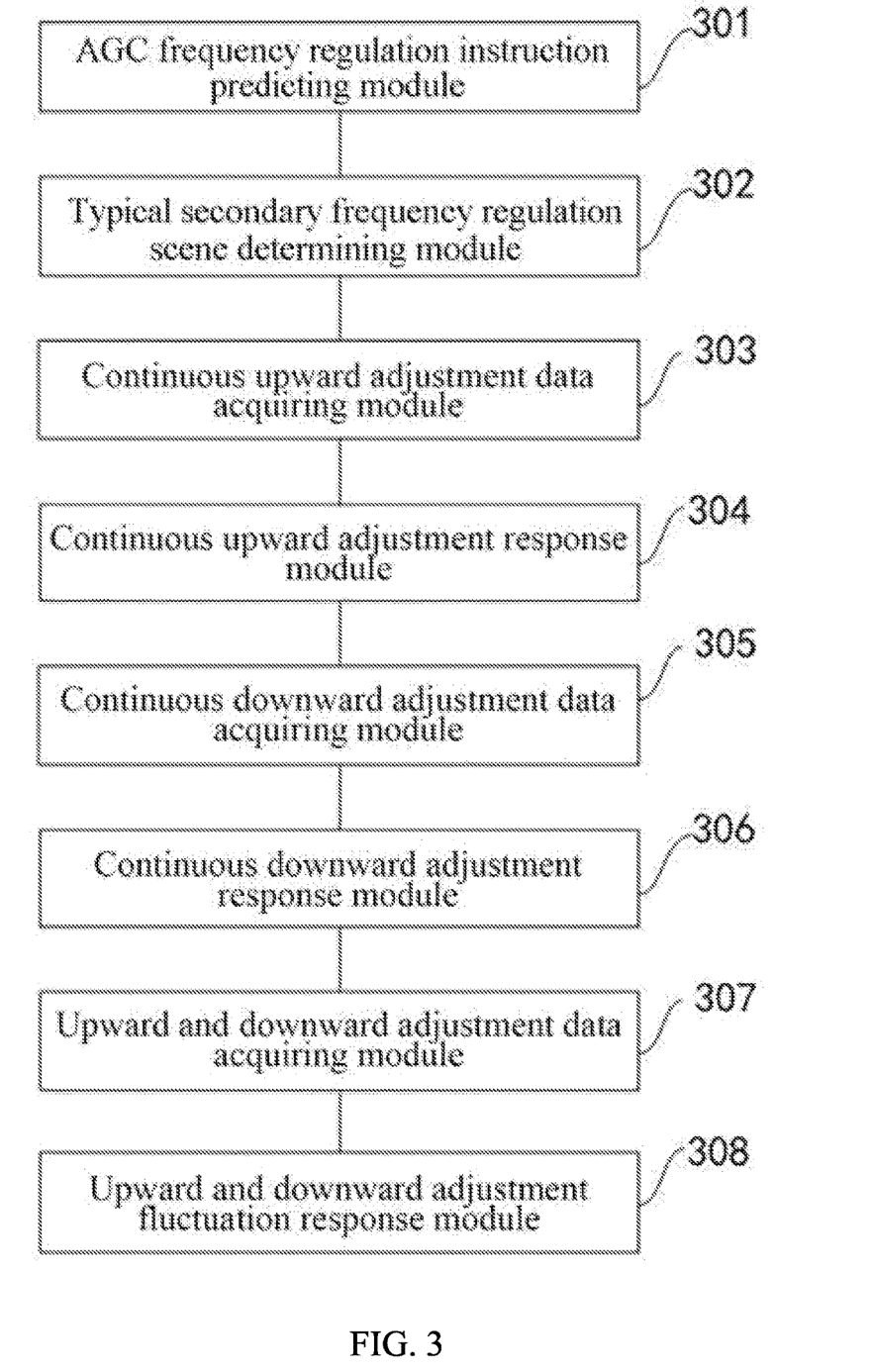
FIG. 3 is a structural schematic diagram of a system for dispatching an independent energy storage power station in a typical secondary frequency regulation scenario according to the present disclosure.

Based on the method according to the present disclosure, the present disclosure further provides an independent energy storage power station dispatching system for a typical secondary frequency regulation scenario. As shown in FIG. 3, the system comprises an AGC frequency regulation instruction predicting module 301, a typical secondary frequency regulation scenario determining module 302, a continuous upward adjustment data acquiring module 303, a continuous upward adjustment response module 304, a continuous downward adjustment data acquiring module 305, a continuous downward adjustment response module 306, an upward and downward adjustment data acquiring module 307 and an upward and downward adjustment fluctuation response module 308.

The AGC frequency regulation instruction predicting module 301 is configured to predict an AGC frequency regulation instruction for a next stage based on a frequency regulation control data for an automatic generation control AGC frequency regulation control area, wherein the frequency regulation control data includes historical operation data of a unit in the AGC frequency regulation control area, a power generation plan, a load supply and demand condition and a power grid operation condition.

The typical secondary frequency regulation scenario determining module 302 is configured to determine the current typical secondary frequency regulation scenario according to the AGC frequency regulation instruction for the next stage, wherein the typical secondary frequency regulation scenario includes a continuous upward adjustment response scenario, a continuous downward adjustment response scenario and an upward and downward adjustment fluctuation response scenario.

The continuous upward adjustment data acquiring module 303 is configured to, if the current typical secondary frequency regulation scenario is the continuous upward adjustment response scenario, acquire data required for the continuous upward adjustment, wherein the data required for the continuous upward adjustment includes a currently required upward adjustment response capacity of the power grid, a currently available upward adjustment response capacity of the independent energy storage power station and a currently available upward adjustment response capacity of a conventional unit.

The continuous upward adjustment response module 304 is configured to, for the continuous upward adjustment response scenario, dispatch the independent energy storage power station to participate in the upward adjustment response according to the data required for the continuous upward adjustment.

The continuous downward adjustment data acquiring module 305 is configured to, if the current typical secondary frequency regulation scenario is the continuous downward adjustment response scenario, acquire data required for the continuous downward adjustment, wherein the data required for the continuous downward adjustment includes a currently required downward adjustment response capacity of the power grid, a currently available downward adjustment response capacity of the independent energy storage power station and a currently available downward adjustment response capacity of a conventional unit.

The continuous downward adjustment response module 306 is configured to, for the continuous downward adjustment response scenario, dispatch the independent energy storage power station to participate in the downward adjustment response according to the data required for the continuous downward adjustment.

The upward and downward adjustment data acquiring module 307 is configured to, if the current typical secondary frequency regulation scenario is the upward and downward adjustment fluctuation response scenario, acquire data required for the upward and downward adjustment, wherein the data required for the upward and downward adjustment includes the currently required upward adjustment response capacity of the power grid, the currently available upward adjustment response capacity of the independent energy storage power station, the currently required downward adjustment response capacity of the power grid and the currently available downward adjustment response capacity of the independent energy storage power station.

The upward and downward adjustment fluctuation response module 308 is configured to, in the case of the upward and downward adjustment fluctuation response scenario, preferably dispatch the independent energy storage power station to participate in the upward and downward adjustment fluctuation response according to the data required for the upward and downward adjustment.

In an embodiment, the system further comprises a secondary frequency regulation time period determining module.

The secondary frequency regulation time period determining module is configured to determine whether it is a period of time when the independent energy storage power station is dispatched to participate in the secondary frequency regulation, wherein if so, the typical secondary frequency regulation scenario determining module is executed, and if not, the dispatching process is ended.

The continuous upward adjustment response module 304 specifically comprises an upward adjustment response-based secondary frequency regulation value calculating unit and a continuous upward adjustment response unit.

The upward adjustment response-based secondary frequency regulation value calculating unit is configured to, in the case of the continuous upward adjustment response scenario, determine a secondary frequency regulation value $C_{st}^{up}$ when the independent energy storage power station participates in the upward adjustment response, by using a formula $C_{st}^{up}=\min(C_{st\_up} \times C_{up}/(C_{st\_up}+C_{gen\_up}), C_{st\_up})$, according to the data required for the continuous upward adjustment, wherein $C_{up}$ denotes the currently required upward adjustment response capacity of the power grid, $C_{st\_up}$ denotes the currently available upward adjustment response capacity of the independent energy storage power station, $C_{gen\_up}$ denotes the currently available upward adjustment response capacity of a conventional unit, and min ( ) indicates to take a minimum value of the parameter in parentheses.

The continuous upward adjustment response unit is configured to dispatch the independent energy storage power station to participate in the upward adjustment response according to the secondary frequency regulation value $C_{st}^{up}$ when the independent energy storage power station participates in the upward adjustment response.

The continuous downward adjustment response module 306 specifically comprises a downward adjustment response-based secondary frequency regulation value calculating unit and a continuous downward adjustment response unit.

The downward adjustment response-based secondary frequency regulation value calculating unit is configured to, in the case of the continuous downward adjustment response scenario, determine a secondary frequency regulation value $C_{st}^{dn}$ when the independent energy storage power station participates in the downward adjustment response, by using a formula $C_{st}^{dn}=\min(C_{st\_dn} \times C_{dn}/(C_{st\_dn}+C_{gen\_dn}), C_{st\_dn})$, according to the data required for the continuous downward adjustment, wherein $C_{dn}$ denotes the currently required downward adjustment response capacity of the power grid, $C_{st\_dn}$ denotes the currently available downward adjustment response capacity of the independent energy storage power station, $C_{gen\_dn}$ denotes the currently available downward adjustment response capacity of a conventional unit.

The continuous downward adjustment response unit is configured to dispatch the independent energy storage power station to participate in the downward adjustment response according to the secondary frequency regulation value $C_{st}^{dn}$ when the independent energy storage power station participates in the downward adjustment response.

The upward and downward adjustment fluctuation response module 308 specifically comprises an upward and downward adjustment response-based secondary frequency regulation value calculating unit and an upward and downward adjustment fluctuation response unit.

The upward and downward adjustment response-based secondary frequency regulation value calculating unit is configured to, in the case of the upward and downward adjustment response scenario, according to the data required for the upward and downward adjustment, determine the secondary frequency regulation value $C_{st}^{up}$ when the independent energy storage power station participates in the upward adjustment response, by using the formula $C_{st}^{up}=\min(C_{st\_up},C_{up})$, and determine the secondary frequency regulation value $C_{st}^{dn}$ when the independent energy storage power station participates in the downward adjustment response, by using the formula $C_{st}^{dn}=\min(C_{st\_dn},C_{dn})$, wherein $C_{up}$ denotes the currently required upward adjustment response capacity of the power grid, $C_{st\_up}$ denotes the currently available upward adjustment response capacity of the independent energy storage power station, $C_{dn}$ denotes the currently required downward adjustment response capacity of the power grid, $C_{st\_dn}$ denotes the currently available downward adjustment response capacity of the independent energy storage power station, and min ( ) indicates to take the minimum value of the parameter in parentheses.

The upward and downward adjustment fluctuation response unit is configured to, preferably dispatch the independent energy storage power station to participate in the upward and downward adjustment fluctuation response according to the secondary frequency regulation value $C_{st}^{up}$ when the independent energy storage power station participates in the upward adjustment response and the secondary frequency regulation value $C_{st}^{dn}$ when the independent energy storage power station participates in the downward adjustment response.

Because the system disclosed in the embodiment corresponds to the method disclosed in the embodiment, the system is described simply. Refer to the description of the method for the relevant points.

Specific examples are used herein to explain the principle and implementation of the present disclosure, and the explanations of the above embodiments are only used to help understand the method and core ideas of the present disclosure. Further, according to the idea of the present disclosure, those skilled in the art can make some changes in the specific implementation and application scope. To sum up, the contents of the specification should not be construed as limiting the present disclosure.

What is claimed is:

1. A method for dispatching an independent energy storage power station in a typical secondary frequency regulation scenario, comprising:
   predicting an AGC frequency regulation instruction for a next stage based on a frequency regulation control data for an automatic generation control AGC frequency regulation control area, wherein the frequency regulation control data comprises historical operation data of units in the AGC frequency regulation control area, a power generation plan, a load supply and demand condition and a power grid operation condition;
   determining a current typical secondary frequency regulation scenario according to the AGC frequency regulation instruction for the next stage, wherein the typical secondary frequency regulation scenario comprises a continuous upward adjustment response scenario, a continuous downward adjustment response scenario and an upward and downward adjustment fluctuation response scenario;
   acquiring data required for a continuous upward adjustment, if the current typical secondary frequency regulation scenario is the continuous upward adjustment response scenario, wherein the data required for the continuous upward adjustment comprises a currently required upward adjustment response capacity of the power grid, a currently available upward adjustment response capacity of the independent energy storage power station and a currently available upward adjustment response capacity of a conventional unit;
   dispatching, for the continuous upward adjustment response scenario, the independent energy storage power station to participate in an upward adjustment response according to the data required for the continuous upward adjustment, which comprises:
     determining, for the continuous upward adjustment response scenario, a secondary frequency regulation value $C_{st}^{up}$ when the independent energy storage power station participates in the upward adjustment response, by using a formula $C_{st}^{up}=\min(C_{st\_up} \times C_{up}/(C_{st\_up}+C_{gen\_up}),C_{st\_up})$, according to the data required for the continuous upward adjustment, wherein $C_{up}$ denotes the currently required upward adjustment response capacity of the power grid, $C_{st\_up}$ denotes the currently available upward adjustment response capacity of the independent energy storage power station, $C_{gen\_up}$ denotes the currently available upward adjustment response capacity of the conventional unit, and min ( ) indicates to take a minimum value of a parameter in parentheses; and dispatching the independent energy storage power station to participate in the upward adjustment response according to the secondary frequency regulation value $C_{st}^{up}$ when the independent energy storage power station participates in the upward adjustment response;

acquiring data required for a continuous downward adjustment, if the current typical secondary frequency regulation scenario is the continuous downward adjustment response scenario, wherein the data required for the continuous downward adjustment comprises a currently required downward adjustment response capacity of the power grid, a currently available downward adjustment response capacity of the independent energy storage power station and a currently available downward adjustment response capacity of the conventional unit;

dispatching, for the continuous downward adjustment response scenario, the independent energy storage power station to participate in the downward adjustment response according to the data required for the continuous downward adjustment, which comprises:

determining, for the continuous downward adjustment response scenario, a secondary frequency regulation value $C_{st}^{dn}$ when the independent energy storage power station participates in the downward adjustment response, by using a formula $C_{st}^{dn}=\min(C_{st\_dn} \times C_{dn}/(C_{st\_dn}+C_{gen\_dn}), C_{st\_dn})$, according to the data required for the continuous downward adjustment, wherein $C_{dn}$ denotes the currently required downward adjustment response capacity of the power grid, $C_{st\_dn}$ denotes the currently available downward adjustment response capacity of the independent energy storage power station, $C_{gen\_dn}$ denotes the currently available downward adjustment response capacity of the conventional unit, and min ( ) indicates to take a minimum value of a parameter in parentheses; and dispatching the independent energy storage power station to participate in the downward adjustment response according to the secondary frequency regulation value $C_{st}^{dn}$ when the independent energy storage power station participates in the downward adjustment response;

acquiring data required for the upward and downward adjustment, if the current typical secondary frequency regulation scenario is the upward and downward adjustment fluctuation response scenario, wherein the data required for the upward and downward adjustment comprises the currently required upward adjustment response capacity of the power grid, the currently available upward adjustment response capacity of the independent energy storage power station, the currently required downward adjustment response capacity of the power grid and the currently available downward adjustment response capacity of the independent energy storage power station; and for the upward and downward adjustment fluctuation response scenario, dispatching the independent energy storage power station to participate in the upward and downward adjustment fluctuation response according to the data required for the upward and downward adjustment, which comprises:

for the upward and downward adjustment response scenario, according to the data required for upward and downward adjustment, determining a secondary frequency regulation value $C_{st}^{up}$ when the independent energy storage power station participates in the upward adjustment response, by using a formula $C_{st}^{up}=\min(C_{st\_up},C_{up})$, and determining a secondary frequency regulation value $C_{st}^{dn}$ when the independent energy storage power station participates in the downward adjustment response, by using a formula $C_{st}^{dn}=\min(C_{st\_dn},C_{dn})$ wherein $C_{up}$ denotes the currently required upward adjustment response capacity of the power grid, $C_{st\_up}$ denotes the currently available upward adjustment response capacity of the independent energy storage power station, $C_{dn}$ denotes the currently required downward adjustment response capacity of the power grid, $C_{st\_dn}$ denotes the currently available downward adjustment response capacity of the independent energy storage power station, and min ( ) indicates to take a minimum value of a parameter in parentheses; and dispatching the independent energy storage power station to participate in the upward and downward adjustment fluctuation response according to the secondary frequency regulation value $C_{st}^{up}$ when the independent energy storage power station participates in the upward adjustment response and the secondary frequency regulation value $C_{st}^{dn}$ when the independent energy storage power station participates in the downward adjustment response.

2. The method according to claim 1, wherein before the determining a current typical secondary frequency regulation scenario according to the AGC frequency regulation instruction for the next stage, the method further comprises determining whether it is a period of time when the independent energy storage power station is dispatched to participate in the secondary frequency regulation, and if so, proceeding to determine a current typical secondary frequency regulation scenario according to the AGC frequency regulation instruction for the next stage, and if not, ending the dispatching process.

3. A system for dispatching an independent energy storage power station in a typical secondary frequency regulation scenario, comprising:

an AGC frequency regulation instruction predicting module, which is configured to predict an AGC frequency regulation instruction for a next stage based on a frequency regulation control data for an automatic generation control AGC frequency regulation control area, wherein the frequency regulation control data comprises historical operation data of units in the AGC frequency regulation control area, a power generation plan, a load supply and demand condition and a power grid operation condition;

a typical secondary frequency regulation scenario determining module, which is configured to determine the current typical secondary frequency regulation scenario according to the AGC frequency regulation instruction for the next stage, wherein the typical secondary frequency regulation scenario comprises a continuous upward adjustment response scenario, a continuous downward adjustment response scenario and an upward and downward adjustment fluctuation response scenario;

a continuous upward adjustment data acquiring module, which is configured to, if the current typical secondary frequency regulation scenario is the continuous upward adjustment response scenario, acquire data required for a continuous upward adjustment, wherein the data required for the continuous upward adjustment comprises a currently required upward adjustment response capacity of the power grid, a currently available upward adjustment response capacity of the independent energy storage power station and a currently available upward adjustment response capacity of a conventional unit;

a continuous upward adjustment response module, which is configured to, for the continuous upward adjustment response scenario, dispatch the independent energy storage power station to participate in an upward adjustment response according to the data required for the continuous upward adjustment; and the continuous upward adjustment response module comprising:

an upward adjustment response-based secondary frequency regulation value calculating unit, which is configured to, for the continuous upward adjustment response scenario, determine a secondary frequency regulation value $C_{st}^{up}$ when the independent energy storage power station participates in the upward adjustment response, by using a formula $C_{st}^{up}=\min(C_{st\_up} \times C_{up}/(C_{st\_up}+C_{gen\_up}), C_{st\_up})$, according to the data required for the continuous upward adjustment, wherein $C_{up}$ denotes the currently required upward adjustment response capacity of the power grid, $C_{st\_up}$ denotes the currently available upward adjustment response capacity of the independent energy storage power station, $C_{gen\_up}$ denotes the currently available upward adjustment response capacity of the conventional unit, and min ( ) indicates to take a minimum value of the parameter in parentheses; and a continuous upward adjustment response unit, which is configured to dispatch the independent energy storage power station to participate in the upward adjustment response according to the secondary frequency regulation value $C_{st}^{up}$ when the independent energy storage power station participates in the upward adjustment response;

a continuous downward adjustment data acquiring module, which is configured to, if the current typical secondary frequency regulation scenario is the continuous downward adjustment response scenario, acquire data required for a continuous downward adjustment, wherein the data required for the continuous downward adjustment comprises a currently required downward adjustment response capacity of the power grid, a currently available downward adjustment response capacity of the independent energy storage power station and a currently available downward adjustment response capacity of the conventional unit;

a continuous downward adjustment response module, which is configured to, for the continuous downward adjustment response scenario, dispatch the independent energy storage power station to participate in the downward adjustment response according to the data required for the continuous downward adjustment, the continuous downward adjustment response module comprising:

a downward adjustment response-based secondary frequency regulation value calculating unit, which is configured to, for the continuous downward adjustment response scenario, determine a secondary frequency regulation value $C_{st}^{dn}$ when the independent energy storage power station participates in the downward adjustment response, by using a formula $C_{st}^{dn}=\min(C_{st\_dn} \times C_{dn}/(C_{st\_dn}+C_{gen\_dn}), C_{st\_dn})$ according to the data required for the continuous downward adjustment, wherein $C_{dn}$ denotes the currently required downward adjustment response capacity of the power grid, $C_{st\_dn}$ denotes the currently available downward adjustment response capacity of the independent energy storage power station, $C_{gen\_dn}$ denotes the currently available downward adjustment response capacity of a conventional unit, and min ( ) indicates to take a minimum value of a parameter in parentheses; and a continuous downward adjustment response unit, which is configured to dispatch the independent energy storage power station to participate in the downward adjustment response according to the secondary frequency regulation value $C_{st}^{dn}$ when the independent energy storage power station participates in the downward adjustment response;

an upward and downward adjustment data acquiring module, which is configured to, if the current typical secondary frequency regulation scenario is the upward and downward adjustment fluctuation response scenario, acquire data required for the upward and downward adjustment, wherein the data required for the upward and downward adjustment comprises the currently required upward adjustment response capacity of the power grid, the currently available upward adjustment response capacity of the independent energy storage power station, the currently required downward adjustment response capacity of the power grid and the currently available downward adjustment response capacity of the independent energy storage power station; and an upward and downward adjustment fluctuation response module, which is configured to, for the upward and downward adjustment fluctuation response scenario, dispatch the independent energy storage power station to participate in the upward and downward adjustment fluctuation response according to the data required for the upward and downward adjustment, the upward and downward adjustment fluctuation response module comprising:

an upward and downward adjustment response-based secondary frequency regulation value calculating unit, which is configured to, for the upward and downward adjustment response scenario, according to the data required for the upward and downward adjustment, determine a secondary frequency regulation value $C_{st}^{up}$ when the independent energy storage power station participates in the upward adjustment response, by using a formula $C_{st}^{up}=\min(C_{st\_up}, C_{up})$, and determine a secondary frequency regulation value $C_{st}^{dn}$ when the independent energy storage power station participates in the downward adjustment response, by using a formula $C_{st}^{dn}=\min(C_{st\_dn}, C_{dn})$, wherein $C_{up}$ denotes the currently required upward adjustment response capacity of the power grid, $C_{st\_up}$ denotes the currently available upward adjustment response capacity of the independent energy storage power station, $C_{dn}$ denotes the currently required downward adjustment response capacity of the power grid, $C_{st\_dn}$ denotes the currently available downward adjustment response capacity of the independent energy storage power station, and min ( ) indicates to take a minimum value of a parameter in parentheses; and an upward and downward adjustment fluctuation response unit, which is configured to, dispatch the independent energy storage power station to participate in the upward and downward adjustment fluctuation response according to the secondary frequency regulation value $C_{st}^{up}$ when the independent energy storage power station participates in the upward adjustment response and the secondary frequency regulation value $C_{st}^{dn}$ when the independent energy storage power station participates in the downward adjustment response.

4. The system according to claim 3, further comprising a secondary frequency regulation time period determining module, which is configured to determine whether it is a period of time when the independent energy storage power station is dispatched to participate in the secondary frequency regulation, and if so, perform the typical secondary frequency regulation scenario determining module, and if not, end the dispatching process.

\* \* \* \* \*